(12) United States Patent
Tokuda

(10) Patent No.: US 11,043,790 B2
(45) Date of Patent: Jun. 22, 2021

(54) LIGHT EMITTING DEVICE AND METHOD OF MANUFACTURING LIGHT EMITTING DEVICE

(71) Applicant: SHARP KABUSHIKI KAISHA, Osaka (JP)

(72) Inventor: Katsuhiko Tokuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 342 days.

(21) Appl. No.: 16/304,108

(22) PCT Filed: Feb. 27, 2017

(86) PCT No.: PCT/JP2017/007327
§ 371 (c)(1),
(2) Date: Nov. 21, 2018

(87) PCT Pub. No.: WO2017/203773
PCT Pub. Date: Nov. 30, 2017

(65) Prior Publication Data
US 2020/0328570 A1 Oct. 15, 2020

(30) Foreign Application Priority Data
May 25, 2016 (JP) .............................. JP2016-104158

(51) Int. Cl.
*H01S 5/02255* (2021.01)
*H01S 5/02257* (2021.01)
*H01S 5/028* (2006.01)

(52) U.S. Cl.
CPC ........ *H01S 5/02255* (2021.01); *H01S 5/0286* (2013.01); *H01S 5/02257* (2021.01)

(58) Field of Classification Search
CPC ............. H01S 5/02292; H01S 5/02296; H01S 5/0286; H01S 5/022; H01S 5/028; C09K 11/617; H01L 51/10
See application file for complete search history.

(56) References Cited

U.S. PATENT DOCUMENTS 6,686,676 B2 * 2/2004 McNulty ................ B82Y 20/00
313/112
2004/0066815 A1 4/2004 Okazaki et al.
(Continued)

FOREIGN PATENT DOCUMENTS

JP 2004-128273 A 4/2004
JP 2005-108985 A 4/2005
(Continued)

*Primary Examiner* — Tuan N Nguyen
(74) *Attorney, Agent, or Firm* — ScienBiziP, P.C.

(57) ABSTRACT

A light emitting device includes a substrate; a semiconductor light emitting element provided on the substrate; a mirror that is formed on the substrate and reflects light emitted by the semiconductor light emitting element; a first resin disposed apart from the semiconductor light emitting element on an optical path and containing a light diffusing material; and a second resin disposed on the optical path between the semiconductor light emitting element and the low light diffusion portion and covering a light emitting surface of the semiconductor light emitting element at least in a region in which a density of the light is highest. A concentration of a light diffusing material in the second resin is lower than a concentration of the light diffusing material in the first resin.

12 Claims, 2 Drawing Sheets

(56) References Cited

U.S. PATENT DOCUMENTS

| | | | | |
|---|---|---|---|---|
| 2005/0127833 A1* | 6/2005 | Tieszen | ............... | H01L 33/56 |
| | | | | 313/512 |
| 2005/0280014 A1* | 12/2005 | Park | ............... | H01L 33/483 |
| | | | | 257/98 |
| 2006/0245195 A1 | 11/2006 | Kim et al. | | |
| 2012/0008647 A1* | 1/2012 | Matsuda | ............ | C09K 11/7789 |
| | | | | 372/5 |
| 2013/0229106 A1* | 9/2013 | Mitsuishi | ........... | C09K 11/0883 |
| | | | | 313/503 |

FOREIGN PATENT DOCUMENTS

| JP | 2005-209797 A | 8/2005 |
|---|---|---|
| JP | 2006-313896 A | 11/2006 |
| JP | 4906545 B2 | 3/2012 |
| JP | 2013-143428 A | 7/2013 |

\* cited by examiner

LIGHT EMITTING DEVICE AND METHOD OF MANUFACTURING LIGHT EMITTING DEVICE

TECHNICAL FIELD

The present invention relates to a light emitting device and a method of manufacturing the light emitting device.

BACKGROUND ART

Light emitting devices including semiconductor light emitting elements are capable of emitting light having wavelengths suitable for various uses by using compound semiconductors and changing the elemental compositions of light emitting layers. For example, infrared light may be used for optical communications. A light emitting diode (LED) that emits infrared light is used as a light source for wireless optical communications. In recent years, the amount of data to be communicated has increased, and higher communication speeds have been desired.

Accordingly, attempts have been made to use a semiconductor light emitting element, which is capable of achieving a higher communication speed than that achieved by an LED, as a light source for optical communications. However, light emitted into a space from the semiconductor light emitting element has a small spot diameter and is highly coherent, and it is not safe for human eyes to use the emitted light directly. Therefore, the light needs to be diffused to reduce the coherence thereof and increase the spot diameter thereof. PTL 1 discloses a light emitting device according to the related art.

The light emitting device according to the related art described in PTL 1 includes a substrate in which a countersunk hole is formed, a semiconductor laser element provided on the bottom of the countersunk hole, and inclined surfaces that face the semiconductor laser element disposed in the countersunk hole. Light from the semiconductor laser element is reflected by the inclined surfaces and is emitted through the opening of the countersunk hole in a direction perpendicular to the surface of the substrate. Accordingly, the light emitting device is advantageously small. In addition, the semiconductor laser element of the light emitting device is coated with a resin containing a diffusing material to reduce the coherence of the light and increase safety for human eyes.

CITATION LIST

Patent Literature

PTL 1: Japanese Patent No. 4906545

SUMMARY OF INVENTION

Technical Problem

However, the light emitting device according to the related art described in PTL 1 has a problem that since the light diffusing material is present near a light emitting portion at an end face of the semiconductor laser element, the light diffusing material absorbs light and generates heat, which may cause a temperature increase on the end face of the semiconductor laser element. Accordingly, light absorption easily occurs due to reduced bandgap energy on the end face of the semiconductor laser element, and there is a risk that the end face will experience catastrophic optical damage (COD) due to the generated heat. Thus, the light emitting device may not be sufficiently reliable.

The present invention has been made in light of the above-described circumstances, and an object of the present invention is to provide a light emitting device that is smaller, safer, and more reliable and a method of manufacturing the light emitting device.

Solution to Problem

To achieve the above-described object, a light emitting device according to the present invention includes a substrate; a semiconductor light emitting element provided on the substrate; a mirror that is formed on the substrate and reflects light emitted by the semiconductor light emitting element in a direction that crosses a direction in which the light is emitted; a first resin disposed apart from the semiconductor light emitting element on an optical path of the light emitted by the semiconductor light emitting element, the first resin containing a light diffusing material; and a low light diffusion portion disposed on the optical path between the semiconductor light emitting element and the first resin, the low light diffusion portion covering a light emitting surface of the semiconductor light emitting element at least in a region in which a density of the light is highest. A concentration of a light diffusing material in the low light diffusion portion is lower than a concentration of the light diffusing material in the first resin.

In the light emitting device having the above-described structure, the low light diffusion portion may include a second resin, and a concentration of the light diffusing material in the second resin may be lower than the concentration of the light diffusing material in the first resin.

In the light emitting device having the above-described structure, the low light diffusion portion may include a space.

In the light emitting device having the above-described structure, the first resin may contain 1 wt % or more of the light diffusing material.

In the light emitting device having the above-described structure, the second resin may contain 10 wt % or less of the light diffusing material.

In the light emitting device having the above-described structure, the first resin or the second resin that is in contact with the semiconductor light emitting element may have a modulus of elasticity of less than or equal to 50000 MPa.

In the light emitting device having the above-described structure, a light reflecting surface of the mirror may include a first surface including a flat surface or a curved surface.

In the light emitting device having the above-described structure, the mirror may include a second surface that is formed in the first surface and includes a curved surface having a curvature that differs from a curvature of the first surface.

In the light emitting device having the above-described structure, the first resin may be formed to cover the second surface of the mirror.

In the light emitting device having the above-described structure, the first resin may be formed in a region other than a top surface of the semiconductor light emitting element.

In the light emitting device having the above-described structure, at least a portion of a light reflecting surface of the mirror may include an uneven portion.

In the light emitting device having the above-described structure, the light emitted by the semiconductor light emitting element may have a wavelength of 700 nm to 1600 nm.

A method of manufacturing a light emitting device according to the present invention includes the steps of forming a mirror on a substrate; arranging a semiconductor light emitting element in the substrate so that the mirror is positioned downstream of the semiconductor light emitting element in a direction in which light emitted by the semiconductor light emitting element travels; arranging a first resin apart from the semiconductor light emitting element on an optical path of the light emitted by the semiconductor light emitting element, the first resin containing a light diffusing material; and arranging a low light diffusion portion on the optical path between the semiconductor light emitting element and the first resin, the low light diffusion portion covering a light emitting surface of the semiconductor light emitting element at least in a region in which a density of the light is highest. A concentration of a light diffusing material in the low light diffusion portion is lower than a concentration of the light diffusing material in the first resin.

Advantageous Effects of Invention

According to the structure of the present invention, an increase in the size of the light emitting device in the resonator length direction can be suppressed. In other words, the size of the light emitting device can be reduced. In addition, a temperature increase on the light emitting surface of the semiconductor light emitting element can be suppressed, and COD can be prevented. Thus, a light emitting device that is highly reliable can be obtained.

DESCRIPTION OF EMBODIMENTS

Embodiments of the present invention will now be described with reference to the drawings.

First Embodiment

Figure 1:
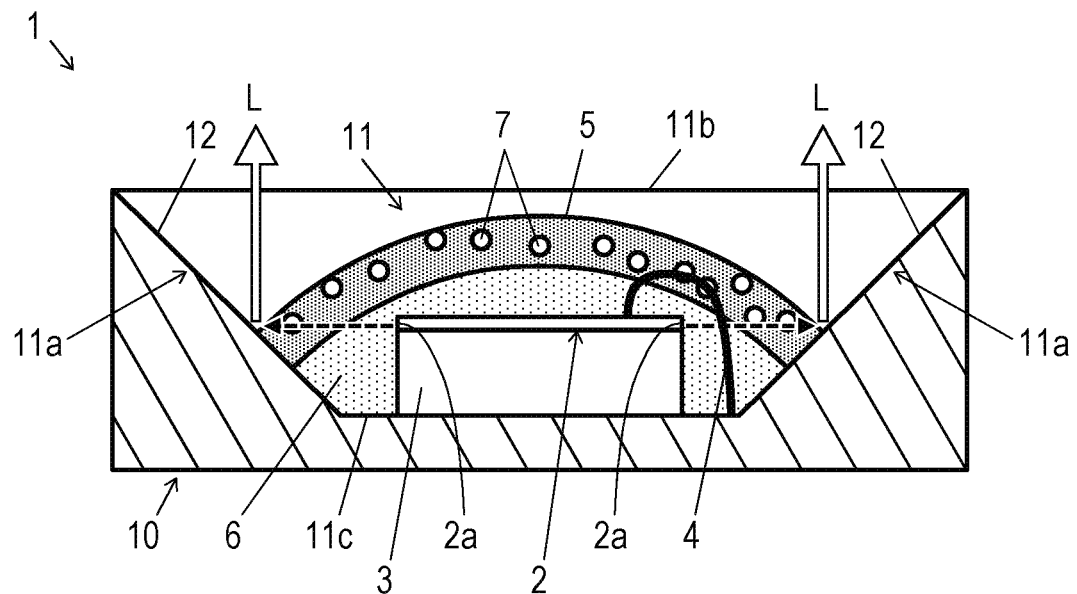
FIG. 1 is a sectional view of a light emitting device according to a first embodiment of the present invention.

The structure of a light emitting device according to a first embodiment of the present invention will be described with reference to FIG. 1. FIG. 1 is a sectional view of the light emitting device.

As illustrated in FIG. 1, a light emitting device 1 includes a semiconductor light emitting element 2 mounted in a substrate 10.

The semiconductor light emitting element 2 is, for example, a semiconductor laser element. The semiconductor light emitting element 2 emits laser light L having a wavelength of, for example, 700 nm to 1600 nm. End faces 2a, which serve as resonator mirrors of the semiconductor laser element and which are perpendicular to the direction in which the laser light L is emitted (resonator length direction), are covered with end-face-protecting films (not shown). In general, a low-reflectance end-face-protecting film having a reflectance of, for example, about 5% is provided on an end face (output mirror) from which laser light is emitted, and a high-reflectance end-face-protecting film having a reflectance of, for example, 95% is provided on the opposite end face (rear mirror). In the present embodiment, to maximize the optical output of the semiconductor laser element, end-face-protecting films having a reflectance of about 5% are provided on both end faces 2a in the direction in which the laser light L is emitted.

The external shape of the substrate 10 is substantially the shape of a rectangular parallelepiped. The substrate 10 is formed by, for example, for example, plating Ag on a Cu alloy. A recess 11 is formed in the substrate 10. In FIG. 1, the recess 11 has an inverted trapezoidal shape in cross section along the direction in which the laser light L is emitted. The recess 11 has side surfaces 11a that are inclined so that the gap therebetween increases from the inside of the substrate 10 toward the top surface of the substrate 10 in FIG. 1, and also has an opening 11b in the top surface of the substrate 10. The side surfaces 11a of the recess 11 are flat surfaces that are adjacent to an inner bottom surface 11c and that are inclined at about 45 degrees with respect to the inner bottom surface 11c.

The semiconductor light emitting element 2 is provided on the top surface of a heat dissipation plate 3 placed on the inner bottom surface 11c of the recess 11 in the substrate 10. The heat dissipation plate 3 is composed of, for example, an AlN ceramic material. The semiconductor light emitting element 2 is arranged so that the side surfaces 11a of the recess 11 are positioned downstream thereof in the direction in which the laser light L travels. The semiconductor light emitting element 2 is electrically connected to the substrate 10 by a wire 4. The material of the wire 4 is, for example, Au, Ag, or Cu. The substrate 10 has a terminal portion (not shown) that provides electrical connection to the outside.

Mirrors 12 are formed on the side surfaces 11a of the recess 11. Since the side surfaces 11a are inclined at about 45 degrees with respect to the inner bottom surface 11c, the mirrors 12 reflect the laser light L emitted from the semiconductor light emitting element 2 in a direction that crosses the direction in which the laser light L is emitted. The mirrors 12 are each composed of a flat surface having, for example, a multilayer reflective film (distributed bragg reflector (DBR)) provided thereon. To facilitate control of emission angle of the reflected laser light L and light distribution control, mirrors having even surfaces are used as the mirrors 12. To ensure safety for human eyes even when the optical output level is high, each mirror 12 may be formed so that at least a portion of a light reflecting surface thereof includes an uneven portion (not shown).

The semiconductor light emitting element 2 is covered with a second resin 6, which serves as a low light diffusion portion, at the periphery thereof. In particular, the second resin 6 covers a light emitting surface of the semiconductor light emitting element 2 at least in a region in which the density of the laser light L is highest, and is disposed on an optical path between the semiconductor light emitting element 2 and a first resin 5, which will be described below. For example, as illustrated in FIG. 1, the entire periphery of the semiconductor light emitting element 2 is covered with the second resin 6. The surface of the second resin 6 is upwardly convexly curved in FIG. 1.

The second resin 6 is composed of a material such as a silicone resin or an epoxy resin. When the second resin 6 is composed of an epoxy resin, the modulus of elasticity of the epoxy resin is preferably less than or equal to 50000 MPa. The second resin 6 includes no light diffusing material for diffusing light.

A surface of the second resin 6 that faces the opening of the recess 11 is covered with the first resin 5. The first resin 5 is provided on the optical path at a position downstream of the second resin 6 in a light traveling direction of the optical path. More specifically, the first resin 5 is disposed apart from the semiconductor light emitting element 2 with the second resin 6 disposed therebetween on the optical path of the laser light L from the semiconductor light emitting element 2. For example, as illustrated in FIG. 1, the entire surface of the second resin 6 that faces the opening of the recess 11 is covered by the first resin 5. The surface of the first resin 5 is upwardly convexly curved in FIG. 1. Accordingly, the laser light L from the semiconductor light emitting element 2 passes through the second resin 6 and the first resin 5 in that order, is reflected by the mirrors 12, and is emitted to the outside of the light emitting device 1.

When, for example, the second resin 6 is a silicone resin, the first resin 5 is composed of the same type of silicone resin as the second resin 6. The first resin 5 contains a light diffusing material 7 whose concentration is higher than that of a light diffusing material in the second resin 6. For example, the first resin 5 contains 10 wt % of the light diffusing material 7.

The first resin 5 may instead be formed in a region other than the top surface of the semiconductor light emitting element 2 in FIG. 1 by arranging the first resin 5 only in a region downstream of the second resin 6 in the light traveling direction of the optical path.

When electricity is supplied to the light emitting device 1 to activate the light emitting device 1, the laser light L is emitted from the semiconductor light emitting element 2 in a direction substantially parallel to the inner bottom surface 11c of the recess 11. The laser light L passes through the second resin 6 and the first resin 5 in that order. Then, the laser light L reaches the inclined side surfaces 11a of the recess 11. The laser light L is reflected by the mirrors 12 formed on the side surfaces 11a at an angle of about 45 degrees with respect to the inner bottom surface 11c in a direction away from the inner bottom surface 11c (upward in FIG. 1). The laser light L is emitted to the outside of the light emitting device 1 through the opening 11b of the recess 11.

A method of manufacturing the light emitting device 1 according to the first embodiment will now be described.

To manufacture the light emitting device 1, first, the recess 11 is formed in the substrate 10. The mirrors 12 are formed on the inclined side surfaces 11a of the recess 11. Then, the heat dissipation plate 3 is placed on the inner bottom surface 11c of the recess 11. The heat dissipation plate 3 is die-bonded by using, for example, Ag paste or AuSn solder.

Subsequently, the semiconductor light emitting element 2 is placed on the top surface of the heat dissipation plate 3. At this time, the semiconductor light emitting element 2 is disposed in the substrate 10 so that the mirrors 12 are positioned downstream of the semiconductor light emitting element 2 in the direction in which the emitted light travels. The semiconductor light emitting element 2 is die-bonded by using, for example, AuSn solder or Ag nanoparticles. End-face-protecting films having a reflectance of about 5% are formed on both the surface of the semiconductor light emitting element 2 from which the laser light L is emitted and the surface at the opposite side.

Subsequently, wire bonding is performed by using the wire 4. Thus, the semiconductor light emitting element 2 is electrically connected to the substrate 10 by the wire 4.

After the semiconductor light emitting element 2 is mounted in and electrically connected to the substrate 10, the second resin 6 is poured into the recess 11. The second resin 6 is poured into the recess 11 so as to cover the light emitting surface of the semiconductor light emitting element 2 at least in a region in which the density of the light is highest. For example, a predetermined amount of the second resin 6 may be dropped onto the semiconductor light emitting element 2 by using a dispenser or the like. When the second resin 6 is a silicone resin, the resin is temporarily cured by heating the resin at about 80° C. for about 5 minutes.

Subsequently, the first resin 5 is poured into the recess 11. The first resin 5 is poured into the recess 11 so that the first resin 5 is disposed on the optical path at a position downstream of the second resin 6 in the light traveling direction of the optical path. Thus, the surface of the resin 6 that faces the opening of the recess 11 is covered by the first resin 5.

According to the above-described structure of the first embodiment, the semiconductor light emitting element 2 is surface-mounted on the inner bottom surface 11c of the recess 11 in the substrate 10, and the mirrors 12 are formed on the side surfaces 11a that are inclined with respect to the inner bottom surface 11c. The mirrors 12 are capable of reflecting the laser light L emitted from the semiconductor light emitting element 2 in a direction that crosses the direction in which the laser light L is emitted (resonator length direction). Accordingly, an increase in the size of the light emitting device 1 in the resonator length direction can be suppressed. In other words, the size of the light emitting device 1 can be reduced.

The light emitting device 1 includes the first resin 5 and the second resin 6 that serves as a low light diffusion portion. The first resin 5 is disposed apart from the semiconductor light emitting element 2 on the optical path of the laser light L, and contains the light diffusing material 7. The second resin 6 is provided on the optical path between the semiconductor light emitting element 2 and the first resin 5, and covers the semiconductor light emitting element 2 in a region in which the density of the laser light L is highest. The second resin 6 contains no light diffusing material. In other words, the concentration of a light diffusing material in the second resin 6 is lower than that of the light diffusing material in the first resin 5. Accordingly, absorption of the laser light L by the second resin 6 can be reduced in the region in which the density of the light from the semiconductor light emitting element 2 is highest. Therefore, a temperature increase on the surface of the semiconductor light emitting element 2 from which the laser light L is emitted can be suppressed, and COD can be prevented. Thus, the light emitting device 1 that is highly reliable can be obtained.

The second resin 6 contains no light diffusing material. In other words, the content of a light diffusing material is less than or equal to 10 wt %. Therefore, a temperature increase on the surface of the semiconductor light emitting element 2 of the light emitting device 1 from which the laser light L is emitted can be effectively suppressed. The first resin 5 contains 10 wt % of the light diffusing material 7. In other words, the content of the light diffusing material 7 is greater than or equal to 1 wt %. Therefore, the light emitting device 1 is capable of emitting the laser light L having low coherence, and safety for human eyes is increased.

Semiconductor laser elements are known to be vulnerable to external stress. For example, an AlGaAs-based semiconductor laser element that emits infrared light has a risk of dislocations in crystals when electricity is applied thereto while an external stress of about $1\times10^9$ dyn/cm$^2$ is applied thereto. This may lead to so-called dark-line degradation, which is a light emission failure in regions where dislocations have occurred. As a result, there is a risk that an oscillation failure will occur due to a reduction in optical output or melting of the crystals. In contrast, the second resin 6 that is in contact with the semiconductor light emitting element 2 of the light emitting device 1 according to the first embodiment has a modulus of elasticity of less than or equal to 50000 MPa, and therefore the occurrence of light emission failure such as dark-line degradation due to external stress can be prevented, and the reliability can be increased.

In addition, since the light reflecting surfaces of the mirrors 12 are flat, the light emitting device 1 can be manufactured by forming the mirrors 12 in a suitable shape in accordance with the material cost, processing cost, and use such as light distribution control.

At least a portion of the light reflecting surface of each mirror 12 may include an uneven portion. In such a case, the reflection angle of the laser light L increases, so that the light diffusing effect is enhanced and safety for human eyes is increased. Thus, safety for human eyes can be increased even when a semiconductor light emitting element that emits relatively strong light is used.

The semiconductor light emitting element 2 emits light having a wavelength of 700 nm to 1600 nm. Therefore, in particular, the structure of the light emitting device 1 effectively increases safety for human eyes against infrared light, which is not visible.

Second Embodiment

Figure 2:
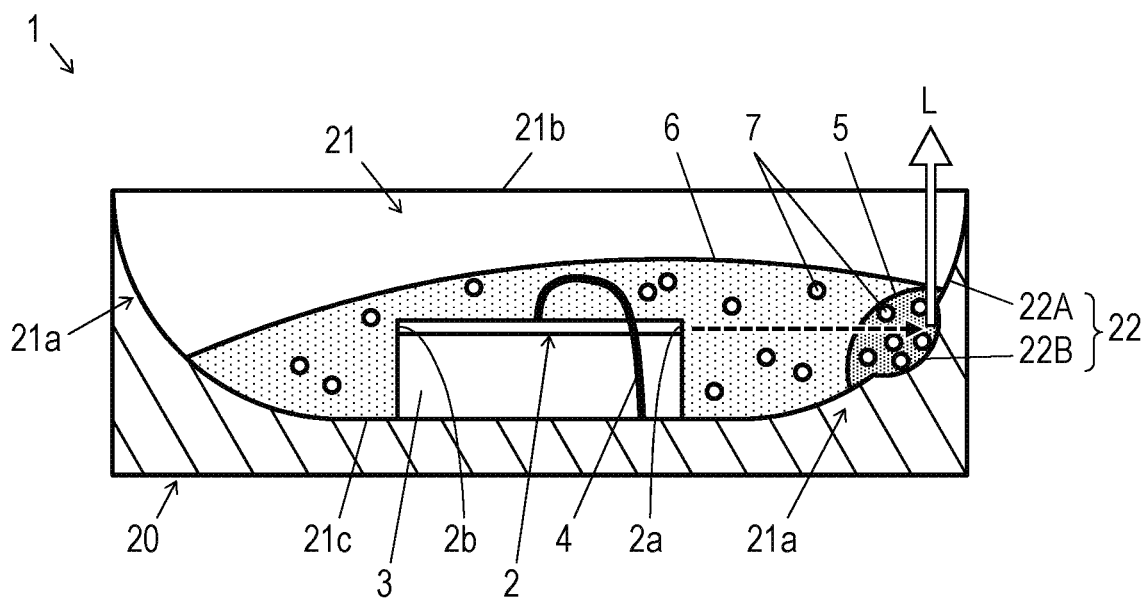
FIG. 2 is a sectional view of a light emitting device according to a second embodiment of the present invention.
Figure 3:
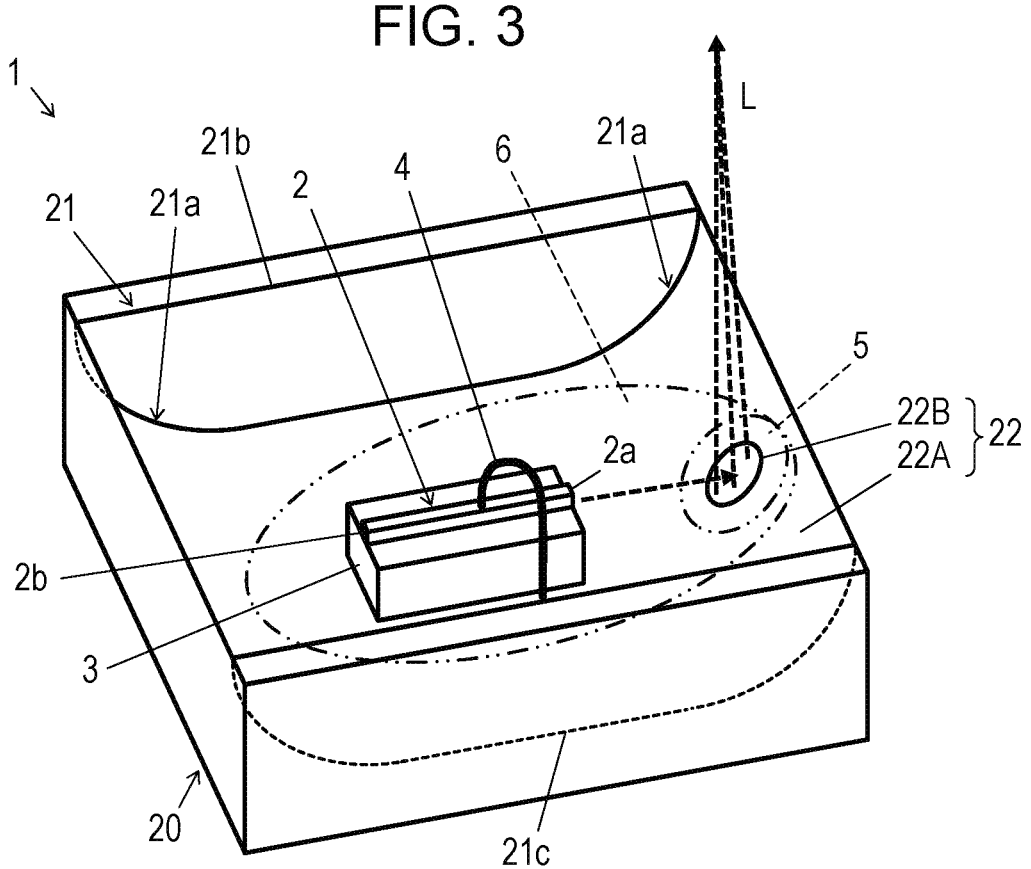
FIG. 3 is a perspective view of the light emitting device according to the second embodiment of the present invention.

A light emitting device according to a second embodiment of the present invention will now be described with reference to FIGS. 2 and 3. FIGS. 2 and 3 are a sectional view and a perspective view, respectively, of the light emitting device. The basic structure of the present embodiment is the same as that of the above-described first embodiment. Therefore, components that are the same as those in the first embodiment are denoted by the same reference numerals or referred to by the same names, and description thereof may be omitted.

As illustrated in FIGS. 2 and 3, a light emitting device 1 according to the second embodiment includes a semiconductor light emitting element 2 mounted in a substrate 20.

The substrate 20 has a substantially rectangular parallelepiped shape, and a recess 21 is formed therein. The recess 21 has side surfaces 21a that are curved so that the gap therebetween increases from the inside of the substrate 20 toward the top surface of the substrate 20 in FIG. 2, and also has an opening 21b in the top surface of the substrate 20. The entirety of each side surface 21a of the recess 21 is curved in a substantially arc shape in vertical cross section taken in the direction in which laser light L is emitted.

The semiconductor light emitting element 2 is provided on the top surface of a heat dissipation plate 3 placed on an inner bottom surface 21c of the recess 21 in the substrate 20. The semiconductor light emitting element 2 is arranged so that the side surfaces 21a of the recess 21 are positioned downstream thereof in the direction in which the laser light L travels.

To maximize the optical output of the semiconductor laser element, an end-face-protecting film having a reflectance of, for example, about 5% is provided on an end face 2a of the semiconductor light emitting element 2 from which the laser light is emitted, and an end-face-protecting film having a reflectance of, for example, 95% is provided on an end face 2b at the opposite side.

A mirror 22 that reflects the laser light L emitted from the semiconductor light emitting element 2 is formed on the curved side surface 21a of the recess 21 that is positioned downstream of the semiconductor light emitting element 2 in the direction in which the laser light L travels. The mirror 22 includes a first surface 22A and a second surface 22B. The entirety of the first surface 22A of the mirror 22 is curved along the side surface 21a. The second surface 22B of the mirror 22 is a portion of the first surface 22A and is formed on the optical path of the laser light L. The second surface 22B is composed of a curved surface having a curvature that differs from and is greater than that of the first surface 22A.

A second resin 6, which serves as a low light diffusion portion, is formed to cover the entire periphery of the semiconductor light emitting element 2. The second resin 6 is composed of, for example, a silicone resin or an epoxy resin. The second resin 6 contains, for example, 10 wt % of a light diffusing material 7.

The first resin 5 is formed to cover the second surface 22B of the mirror 22. In other words, the first resin 5 is formed in a region other than the top surface of the semiconductor light emitting element 2 in FIG. 2. The first resin 5 is provided on the optical path at a position downstream of the second resin 6 in the light traveling direction of the optical path. Accordingly, the laser light L from the semiconductor light emitting element 2 passes through the second resin 6 and the first resin 5 in that order, is reflected by the second surface 22B of the mirror 22, and is emitted to the outside of the light emitting device 1. The first resin 5 contains, for example, 15 wt % of the light diffusing material 7.

A method of manufacturing the light emitting device 1 according to the second embodiment will now be described.

In the manufacturing method of the light emitting device 1 according to the second embodiment, after the semiconductor light emitting element 2 is mounted in and electrically connected to the substrate 10, the first resin 5 is poured into the recess 21 so that the first resin 5 covers the second surface 22B of the mirror 22.

Next, the second resin 6 is poured into the recess 21. The second resin 6 is provided upstream of the first resin 5 in the light traveling direction of the optical path.

Instead of pouring the second resin 6 into the recess 21, a space may be provided between the first resin 5 and a region of the light emitting surface of the semiconductor light emitting element 2 in which the density of the light is highest. In other words, the space may be provided as a low light diffusion portion between the semiconductor light emitting element 2 and the first resin 5.

According to the second embodiment, the low light diffusion portion may be composed of a space. Thus, the space may be used to reduce absorption of the laser light L in the region in which the density of the light from the semiconductor light emitting element 2 is highest. Therefore, a temperature increase on the surface of the semiconductor light emitting element 2 from which the laser light L is emitted can be suppressed, and COD can be prevented. Thus, the light emitting device 1 that is highly reliable can be obtained.

Since the mirror 22 includes the second surface 22B formed in the first surface 22A and composed of a curved surface having a curvature that differs from that of the first surface 22A, light distribution control of the light emitting device 1 can be facilitated.

The first resin 5 is formed to cover the second surface 22B of the mirror 22. Accordingly, the second surface 22B of the mirror 22 serves as a mark that shows the region in which the first resin 5 containing the light diffusing material is to be poured, and the first resin 5 easily accumulates on the second surface 22B. Thus, production of the light emitting device 1 can be facilitated. In addition, since the mirror 22 includes the second surface 22B, the amount of the first resin 5 that is used can be reduced. Accordingly, the size of the light emitting device 1 can be effectively reduced, and the cost can also be reduced.

In addition, the first resin 5 is formed in a region other than the top surface of the semiconductor light emitting element 2 in FIG. 2. Therefore, the size of the light emitting device 1 in the vertical direction in FIG. 2, that is, the height of the light emitting device 1, can be reduced. Thus, the size of the light emitting device 1 can be effectively reduced. In addition, the amount of the first resin 5 that is used can be reduced, so that the cost can be reduced accordingly.

Third Embodiment

Figure 4:
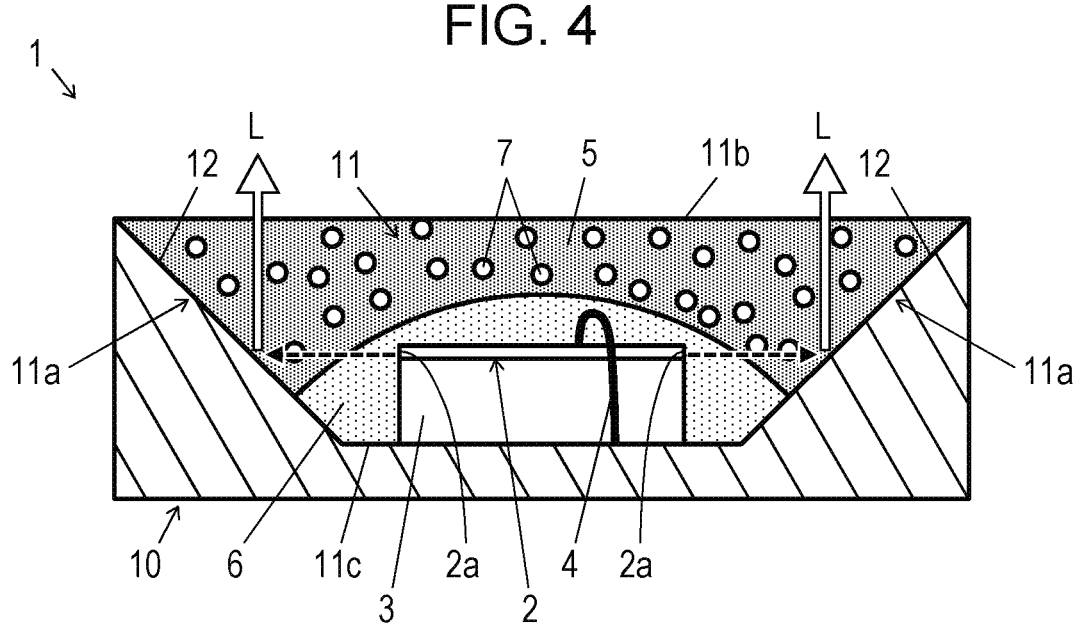
FIG. 4 is a sectional view of a light emitting device according to a third embodiment of the present invention.

A light emitting device according to a third embodiment of the present invention will now be described with reference to FIG. 4. FIG. 4 is a sectional view of the light emitting device. The basic structure of the present embodiment is the same as that of the above-described first embodiment. Therefore, components that are the same as those in the first embodiment are denoted by the same reference numerals or referred to by the same names, and description thereof may be omitted.

As illustrated in FIG. 4, a light emitting device 1 according to the third embodiment includes a semiconductor light emitting element 2 mounted in a substrate 10.

A second resin 6 is formed to cover the entire periphery of the semiconductor light emitting element 2 and the entirety of a wire 4. The second resin 6 is composed of, for example, a silicone resin or an epoxy resin. The second resin 6 contains no light diffusing material.

A first resin 5 is formed to cover the entirety of the surface of the second resin 6 that faces the opening of the recess 11. In addition, the first resin 5 fills the recess 11 to an opening 11b at the top end of the substrate 10 in FIG. 4. The first resin 5 is composed of, for example, an epoxy resin that transmits 80% or more of the laser light L. The first resin 5 contains, for example, 5 wt % of a light diffusing material 7.

The silicone resin and the epoxy resin have poor adhesion to each other at the interface therebetween. Therefore, if a wire is present on the interface, there is a risk that the wire will be pulled due to the difference in coefficient of thermal expansion between the resins in thermal history application during manufacture of the light emitting device 1. This may lead to a breakage of the wire.

Accordingly, in the structure of the third embodiment, the entirety of the wire 4 is disposed inside the second resin 6 composed of a silicone resin, so that the breakage of the wire 4 can be prevented. Thus, the light emitting device 1 is a highly reliable package.

Since the first resin 5 is composed of an epoxy resin, the light emitting device 1 can be picked up with a collet by suction at the first resin 5 on the surface thereof, and then be easily separated from the collet when the suction is ended. Thus, production of the light emitting device 1 can be facilitated.

In addition, since the first resin 5 is composed of an epoxy resin, the adhesion between the first resin 5 and the substrate 10 can be increased. Therefore, separation of the second resin 6 and the first resin 5 from the substrate 10 can be prevented, and the first resin 5 is capable of serving as a lid.

Although embodiments of the present invention have been described, the scope of the present invention is not limited to this, and various modifications are possible within the spirit of the invention.

INDUSTRIAL APPLICABILITY

The present invention is applicable to a light emitting device.

REFERENCE SIGNS LIST 1 light emitting device
2 semiconductor light emitting element
2a, 2b end face
3 heat dissipation plate
4 wire
5 first resin
6 second resin (low light diffusion portion)
7 light diffusing material
10, 20 substrate
11 21 recess
12 22 mirror
22A first surface
22B second surface

The invention claimed is:

1. A light emitting device comprising:
a substrate;
a semiconductor light emitting element provided on the substrate;
a mirror that is formed on the substrate and reflects light emitted by the semiconductor light emitting element in a direction that crosses a direction in which the light is emitted;
a first resin disposed apart from the semiconductor light emitting element on an optical path of the light emitted by the semiconductor light emitting element, the first resin containing a light diffusing material and being disposed below a top surface of the substrate; and
a low light diffusion portion disposed on the optical path between the semiconductor light emitting element and the first resin, the low light diffusion portion covering a light emitting surface of the semiconductor light emitting element at least in a region in which a density of the light is highest,
wherein a concentration of a light diffusing material in the low light diffusion portion is lower than a concentration of the light diffusing material in the first resin,
wherein a light reflecting surface of the mirror includes a first surface including a flat surface or a curved surface, and
wherein the mirror includes a second surface that is formed in the first surface and includes a curved surface having a curvature that differs from a curvature of the first surface.

2. The light emitting device according to claim 1, wherein the low light diffusion portion includes a second resin, and wherein a concentration of the light diffusing material in the second resin is lower than the concentration of the light diffusing material in the first resin.

3. The light emitting device according to claim 2, wherein the second resin contains 10 wt % or less of the light diffusing material.

4. The light emitting device according to claim 1, wherein the low light diffusion portion includes a space.

5. The light emitting device according to claim 1, wherein the first resin contains 1 wt % or more of the light diffusing material.

6. The light emitting device according to claim 1, wherein the first resin or the second resin that is in contact with the semiconductor light emitting element has a modulus of elasticity of less than or equal to 50000 MPa.

7. The light emitting device according to claim 1, wherein the first resin is formed to cover the second surface of the mirror.

8. The light emitting device according to claim 1, wherein the first resin is formed in a region other than a top surface of the semiconductor light emitting element.

9. The light emitting device according to claim 1, wherein at least a portion of the light reflecting surface of the mirror includes an uneven portion.

10. The light emitting device according to claim 1, wherein the light emitted by the semiconductor light emitting element has a wavelength of 700 nm to 1600 nm.

11. A method of manufacturing a light emitting device, the method comprising the steps of:
    forming a mirror on a substrate;
    arranging a semiconductor light emitting element in the substrate so that the mirror is positioned downstream of the semiconductor light emitting element in a direction in which light emitted by the semiconductor light emitting element travels;
    arranging a first resin apart from the semiconductor light emitting element on an optical path of the light emitted by the semiconductor light emitting element, the first resin containing a light diffusing material and being disposed below a top surface of the substrate; and
    arranging a low light diffusion portion on the optical path between the semiconductor light emitting element and the first resin, the low light diffusion portion covering a light emitting surface of the semiconductor light emitting element at least in a region in which a density of the light is highest,
    wherein a concentration of a light diffusing material in the low light diffusion portion is lower than a concentration of the light diffusing material in the first resin,
    wherein a light reflecting surface of the mirror includes a first surface including a flat surface or a curved surface, and
    wherein the mirror includes a second surface that is formed in the first surface and includes a curved surface having a curvature that differs from a curvature of the first surface.

12. A light emitting device comprising:
    a substrate;
    a semiconductor light emitting element provided on the substrate;
    a mirror that is formed on the substrate and reflects light emitted by the semiconductor light emitting element in a direction that crosses a direction in which the light is emitted;
    a first resin disposed apart from the semiconductor light emitting element on an optical path of the light emitted by the semiconductor light emitting element, the first resin containing a light diffusing material; and
    a low light diffusion portion disposed on the optical path between the semiconductor light emitting element and the first resin, the low light diffusion portion covering a light emitting surface of the semiconductor light emitting element at least in a region in which a density of the light is highest,
    wherein a concentration of a light diffusing material in the low light diffusion portion is lower than a concentration of the light diffusing material in the first resin,
    wherein the first resin is formed in a region other than a top surface of the semiconductor light emitting element,
    wherein a light reflecting surface of the mirror includes a first surface including a flat surface or a curved surface, and
    wherein the mirror includes a second surface that is formed in the first surface and includes a curved surface having a curvature that differs from a curvature of the first surface.

* * * * *